(12) United States Patent　　　(10) Patent No.: US 12,587,195 B2
Kohls　　　(45) Date of Patent: Mar. 24, 2026

(54) NON-CONTACT DIRECTION SELECTOR MECHANISM

(71) Applicant: Snap-on Incorporated, Kenosha, WI (US)

(72) Inventor: Collin Kohls, Kenosha, WI (US)

(73) Assignee: Snap-on Incorporated, Kenosha, WI (US)

( * ) Notice: Subject to any disclaimer, the term of this patent is extended or adjusted under 35 U.S.C. 154(b) by 500 days.

(21) Appl. No.: 17/192,180

(22) Filed: Mar. 4, 2021

(65) Prior Publication Data

US 2022/0286132 A1　　Sep. 8, 2022

(51) Int. Cl.
*H03K 17/97*　　(2006.01)
*B25F 5/00*　　(2006.01)
*G01D 5/14*　　(2006.01)
*H03K 17/95*　　(2006.01)
*H03K 17/96*　　(2006.01)

(52) U.S. Cl.
CPC ............. *H03K 17/97* (2013.01); *B25F 5/001* (2013.01); *G01D 5/145* (2013.01); *H03K 17/9505* (2013.01); *H03K 17/9618* (2013.01); *H03K 2017/9706* (2013.01)

(58) Field of Classification Search
CPC ................................ B25F 5/001; G01D 5/145
USPC ........................................................ 173/170
See application file for complete search history.

(56) References Cited

U.S. PATENT DOCUMENTS

| | | |
|---|---|---|
| 5,712,543 A | 1/1998 | Sjostrom |
| 6,868,919 B1 | 3/2005 | Heiermann et al. |
| 6,923,268 B2 | 8/2005 | Katsuyuki et al. |
| 7,256,520 B2 * | 8/2007 | Braun .................... B24B 23/028 |
| | | 310/216.003 |
| 7,411,144 B2 | 8/2008 | Broghammer |
| 7,868,263 B2 | 1/2011 | Krauth et al. |
| 7,926,585 B2 * | 4/2011 | Pozgay .................. B25B 21/00 |
| | | 173/39 |
| 8,083,007 B2 | 12/2011 | Sekino et al. |
| 9,450,471 B2 | 9/2016 | Mergener et al. |
| 9,457,462 B2 | 10/2016 | Mergener et al. |
| 9,654,050 B2 | 5/2017 | Becker et al. |
| 10,293,447 B2 | 5/2019 | Pellenc |

(Continued)

FOREIGN PATENT DOCUMENTS

| | | |
|---|---|---|
| CN | 201505880 U | 6/2010 |
| CN | 111347377 A | 6/2020 |

(Continued)

OTHER PUBLICATIONS

Taiwan Office Action for corresponding TW Application No. 111107640, dated Mar. 25, 2023, 2 pages.

(Continued)

*Primary Examiner* — Nathaniel C Chukwurah
(74) *Attorney, Agent, or Firm* — Taft, Stettinius & Hollister LLP

(57)　　ABSTRACT

A direction selector mechanism adapted to cause a motor to selectively rotate in either one of first and second rotational directions. The direction selector mechanism includes a selector switch slidably or rotatably coupled to the tool and adapted to be selectively positioned between one of first and second positions, a non-contact actuator disposed in the selector switch, and a non-contact sensor adapted to detect the proximity of the non-contact actuator.

21 Claims, 4 Drawing Sheets

(56) References Cited

U.S. PATENT DOCUMENTS

| | | | |
|---|---|---|---|
| 10,414,033 | B2 | 9/2019 | Ekstrom et al. |
| 10,491,211 | B2 | 11/2019 | Schneider et al. |
| 2004/0206519 | A1 | 10/2004 | Kristen et al. |
| 2008/0053805 | A1 | 3/2008 | Wanek |
| 2010/0038397 | A1* | 2/2010 | Krondorfer ............... B25C 1/06 227/8 |
| 2014/0015383 | A1* | 1/2014 | Kokinelis ................. B25F 5/02 310/68 A |
| 2015/0097641 | A1* | 4/2015 | Chen ...................... H01H 50/16 335/126 |
| 2017/0025934 | A1 | 1/2017 | Stanfield et al. |
| 2018/0085906 | A1* | 3/2018 | Nitsch .................. B25D 16/006 |
| 2019/0134801 | A1* | 5/2019 | Merget .................... B25F 5/026 |
| 2020/0094392 | A1 | 3/2020 | Larsen |
| 2020/0235643 | A1 | 7/2020 | Madineni et al. |

FOREIGN PATENT DOCUMENTS

| | | |
|---|---|---|
| CN | 112074374 A | 12/2020 |
| DE | 3311743 | 10/1985 |
| DE | 29615382 | 12/1996 |
| DE | 19756857 | 7/1999 |
| DE | 102018206866 A1 | 11/2019 |
| EP | 1510299 A2 | 3/2005 |
| JP | 6715258 B2 | 7/2020 |
| WO | 03067620 | 8/2003 |
| WO | 2004062077 | 7/2004 |

OTHER PUBLICATIONS

United Kingdom Office Examination Report for corresponding UK Application No. GB2202568.8, dated Apr. 26, 2023, 4 pages.

Canadian Office Action for corresponding CA Application No. 3,150,792, dated May 4, 2023, 3 pages.

Combined Search and Examination Report for corresponding Application No. GB2202568.8 dated Sep. 5, 2022, 8 pages.

Taiwan Office Action for corresponding Application No. 11120988720 dated Oct. 7, 2022, 10 pages.

Examination Report No. 1 for corresponding Application No. 2022201173 dated Nov. 29, 2022, 3 pages.

Examination Report No. 2 for corresponding Application No. 2022201173 dated Jun. 16, 2023, 3 pages.

Office Action for corresponding Application No. GB2202568.8 dated Aug. 10, 2023, 4 pages.

UK Intellectual Property Office, Examination Report issued in corresponding Application No. GB2202568.8, dated Oct. 1, 2025, 4 pp.

Chinese Patent Office, First Office Action issued in corresponding Application No. 202210204791.4, dated Dec. 31, 2024, 10 pp.

UK Intellectual Property Office, Combined Search and Examination Report issued in corresponding Application No. GB2508370.0, dated Jul. 30, 2025, 7 pp.

* cited by examiner

NON-CONTACT DIRECTION SELECTOR MECHANISM

TECHNICAL FIELD OF THE INVENTION

The present invention relates generally to manually actuated switches, and more particularly to a direction selector mechanism for a power tool.

BACKGROUND OF THE INVENTION

Power tools, such as, for example, impact wrenches, drills, power screwdrivers, power ratchets, etc., are commonly used to output torque, for example to a workpiece, such as a threaded fastener, or via a drill bit or socket. At times, the rotational direction of a motor of the tool must be reversed, for example, when the work piece is left-hand threaded or when a user desires to loosen a right-hand threaded work piece instead of tighten it with the power tool.

Existing power tools typically include direction selector mechanisms that selectively control the rotational direction of the motor of the tool. The direction selector mechanism is typically located adjacent to the activation trigger of the tool.

In other conventional tools, the direction selector mechanism typically includes a printed circuit board (PCB) having a first exposed conducting trace, which is held at a reference voltage. Adjacent to the first exposed conducting trace is a number of additional exposed conducting traces. A spring-like element creating a mechanical and, by nature of a conducting material that it is constructed from, electrical contact, between the first and one of the additional exposed conducting traces. The spring-like element serves to conduct the reference voltage from the first conducting trace to one of the additional conducting traces where it can be measured. The measured voltage is then interpreted as the user's desired direction of rotation of the motor. The interpreted desired direction is then imparted in the motor of the power tool by selective switching of motor control elements. The selection of which of the additional conducting traces receives the reference voltage is made by sliding the spring-like element via a selector lever or switch that is operated by the user.

However, due to the complexity and amount of parts that need to be manufactured and assembled, conventional direction selector mechanisms are expensive and complex to manufacture. Additionally, electrical contact corrosion, mechanical wear (i.e., abrasion), mechanical fatigue, foreign debris ingress, and vibration related contact loss typically occur in conventional direction selector mechanisms.

SUMMARY OF THE INVENTION

The present invention relates broadly to a direction selector mechanism for a power tool, such as, for example, impact wrenches, drills, power screwdrivers, power ratchets, etc., for selecting of one of either first and second motor rotational directions (e.g., clockwise and counterclockwise). The direction selector mechanism utilizes non-contact sensor(s) and actuator(s) to sense the position, relative to a known point, of a selector lever or switch operated by the user to determine the user's desired motor rotational direction of the power tool. The non-contact sensor(s) and actuator(s) can be separated by disposing the non-contact actuator(s) outside a housing of a trigger switch assembly. The present invention results in less components and simpler manufacturing, compared to current designs, and substantially longer life components.

In an embodiment, the present invention broadly comprises a tool. The tool includes a motor adapted to selectively rotate in either one of first and second rotational directions, a trigger adapted to cause operation of the motor, and a direction selector mechanism adapted to select the rotational direction of the motor. The direction selector mechanism includes a selector switch coupled to the tool and adapted to be selectively positioned between one of first and second positions, a non-contact actuator disposed in the selector switch, and a non-contact sensor adapted to detect the proximity of the non-contact actuator.

In another embodiment, the present invention broadly comprises a direction selector mechanism adapted to cause a motor of a tool to selectively rotate in either one of first and second rotational directions. The direction selector mechanism includes a selector switch coupled to the tool and adapted to be selectively disposed between either one of first and second positions, a non-contact actuator disposed in the selector switch, and a non-contact sensor adapted to detect the proximity of the non-contact actuator.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

DETAILED DESCRIPTION OF THE INVENTION

Figure 1:
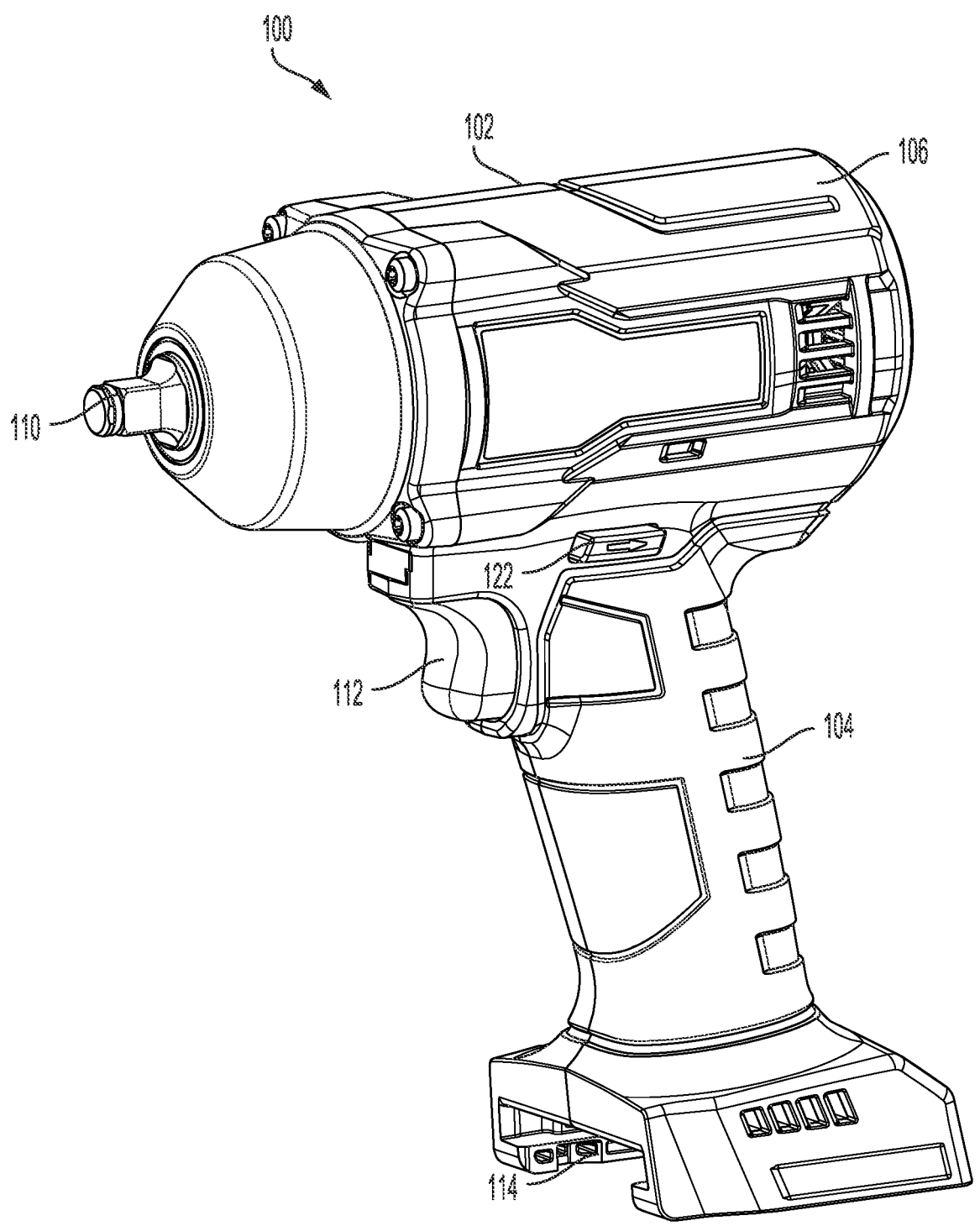
FIG. 1 is a perspective view of an exemplar tool incorporating an embodiment of the present invention.
Figure 2:
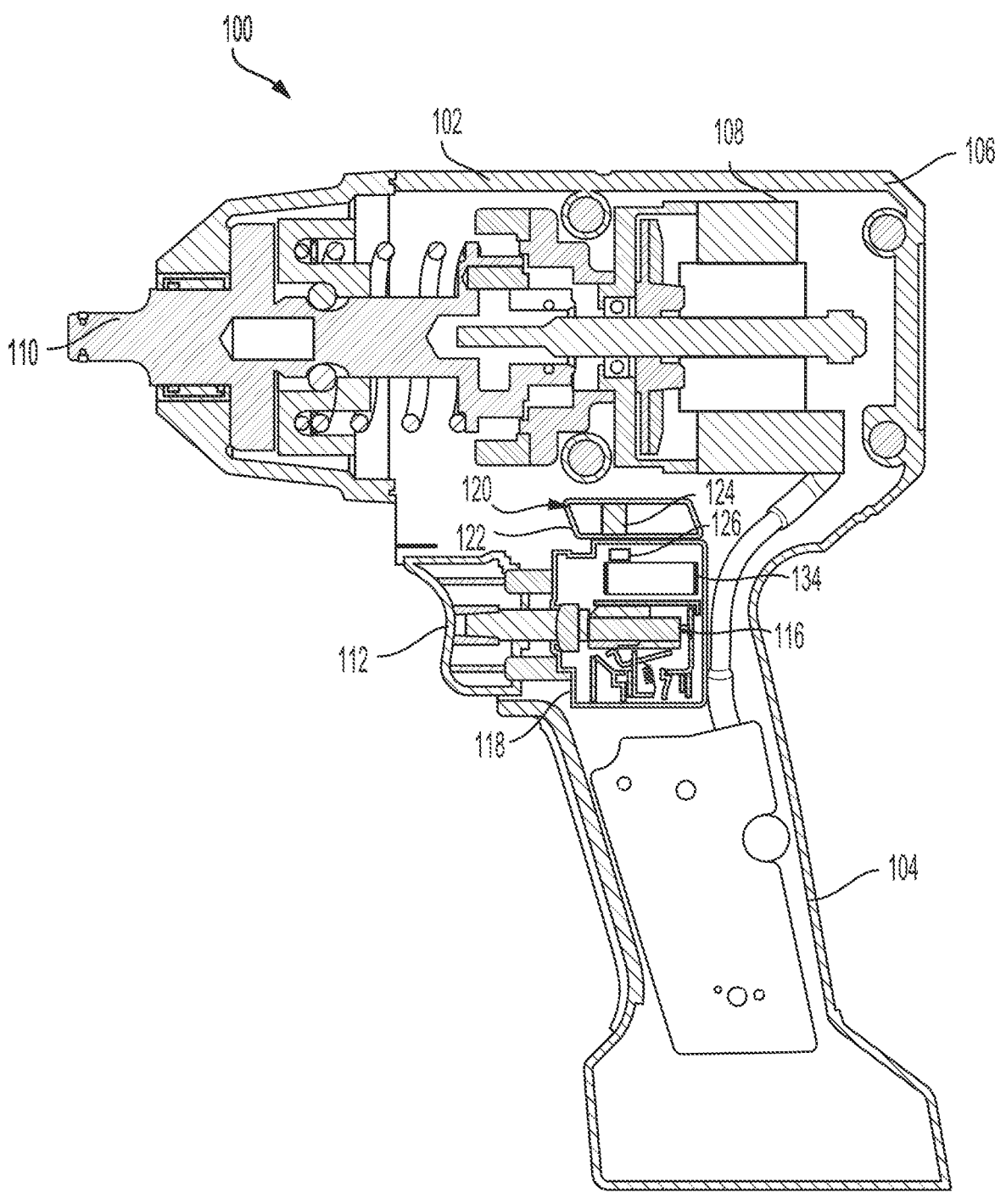
FIG. 2 is a side cross-sectional view of the exemplar tool of FIG. 1.

While the present invention is susceptible of embodiments in many different forms, there is shown in the drawings, and will herein be described in detail, embodiments of the invention, including a preferred embodiment, with the understanding that the present disclosure is to be considered as an exemplification of the principles of the present invention and is not intended to limit the broad aspect of the invention to any one or more embodiments illustrated herein. As used herein, the term "present invention" is not intended to limit the scope of the claimed invention, but is instead used to discuss exemplary embodiments of the invention for explanatory purposes only.

The present invention relates broadly to a rotational direction selector mechanism for a power tool having a rotational output, such as, for example, impact wrenches, drills, power screwdrivers, power ratchets, etc., for selection of either one of first and second motor rotation directions (e.g., clockwise and counterclockwise). The direction selector mechanism of the present invention utilizes one or more non-contact sensors and one or more non-contact actuators to sense the position, relative to a known point, of a selector lever or switch that is operated by the user to determine the user's desired motor rotation direction of the power tool. The non-contact sensors and actuators can be separated by disposing the non-contact actuators outside a housing of a trigger switch assembly and the non-contact sensors inside the housing.

Referring to FIGS. 1-4, an exemplary tool 100 incorporating an embodiment of the present invention, such as, for example, an impact wrench is depicted. However, it will be appreciated that the present invention is not limited as such and can be implemented in not only other power tools, such as, for example, impact wrenches, drills, power screwdrivers, power ratchets, impact drivers, etc., but in other devices that include a motor having a selectable rotational output (for example, a kitchen appliance). In an embodiment, the tool 100 includes a housing 102 assembled from first and second clamshell housing portions that are coupled together to cooperatively form the housing 102. A motor 108 and other additional components of the tool 100 are disposed in the motor housing portion 106. The output drive 110 is adapted to couple with a suitable tool, such as a socket, tool bit, or the like, for interfacing with an associated fastener or the like, to which torque is to be applied, all in a known manner.

A trigger 112 for controlling operation of the motor 108 is disposed on the handle portion 104 adjacent to the motor housing portion 106. Depression of the trigger 112 causes power to be delivered to the motor 108, and hence rotation of the motor 108 selectively in either one of first and second rotational output directions (e.g., clockwise and counter-clockwise), thereby selectively driving the output drive 110 in either one of first and second directions.

In an embodiment, the tool 100 is powered by a battery (not shown), which may be removably coupled at a battery interface 114 of the handle portion 104. In an embodiment, the batter can be rechargeable. However, the present invention is not limited to battery powered tools and can be implemented in tools receiving power from other power sources, such as, for example, external power via a cord.

In an embodiment, the handle portion 104 is a trigger handle that extends substantially perpendicular to the motor housing portion 106, and the trigger 112 is disposed proximal to an intersection of the handle portion 104 and motor housing portion 106. The trigger 112 can be biased such that the user can depress the trigger 112 inwardly, relative to the tool 100, which is detected by a trigger switch 116, using known methods, to cause the motor 108 to operate, and release the trigger 112, where the biased nature of the trigger 112 causes the trigger 112 to bias outwardly, relative to the tool 100, which is detected by the trigger switch 116, to cease operation of the motor 108. The trigger switch 116 is disposed in a trigger housing 118. In an embodiment, the trigger 112 can be a position sensitive trigger that also operates the motor 108 at varying speeds. For example, if the trigger 112 is depressed more, the faster the motor 108 would operate.

The rotational output direction of the motor 108, and, consequently, the output drive 110, is selectively controlled by a direction selector mechanism 120. The direction selector mechanism 120 includes a selector switch 122, a non-contact actuator 124, and a non-contact sensor 126. The selection mechanism is adapted to interpret the user's desired direction of rotation of the motor 108 by determining the proximity of the non-contact actuator 124 to the non-contact sensor 126. The determination of the proximity of the non-contact actuator 124 can be used by a motor controller to control the direction of current through the motor 108 by selective switching of motor control elements to control the rotational direction of the motor 108.

Figure 3:
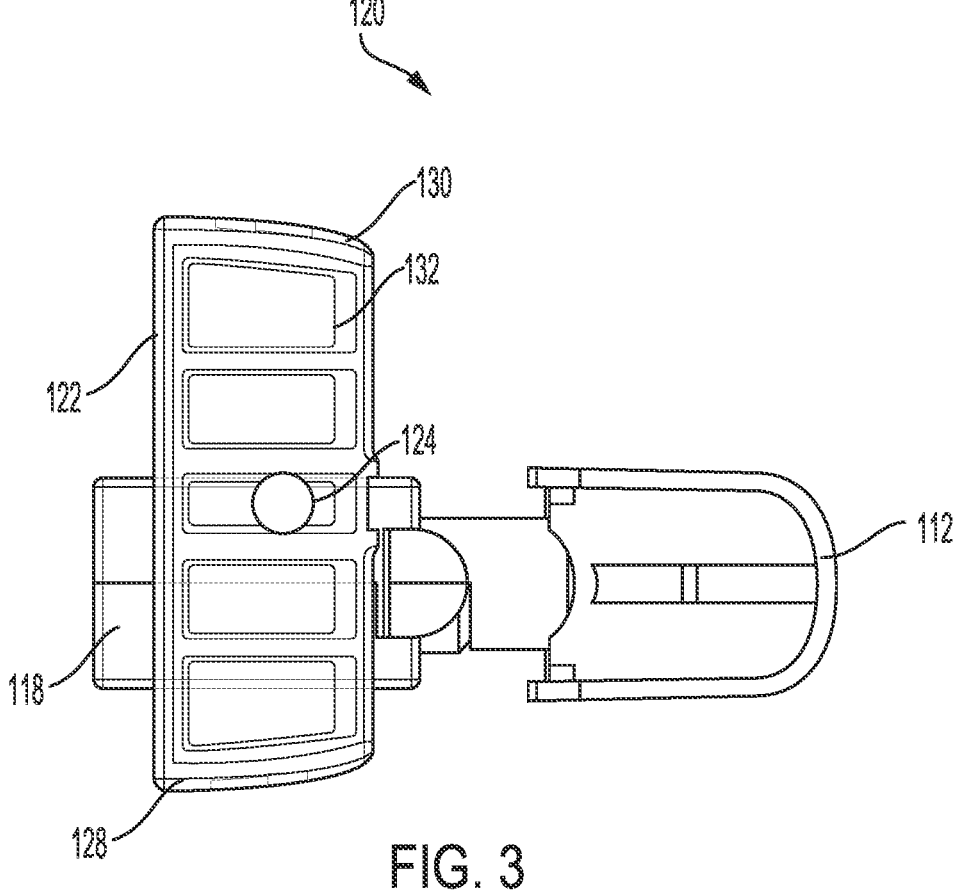
FIG. 3 is a top view of the an exemplar direction selector mechanism, with one of the first and second rotational directions selected, according to an embodiment of the present invention.
Figure 4:
FIG. 4 is a top view of the exemplar direction selector mechanism of FIG. 3, with the other of the first and second rotational directions selected, according to an embodiment of the present invention.
Figure 4:
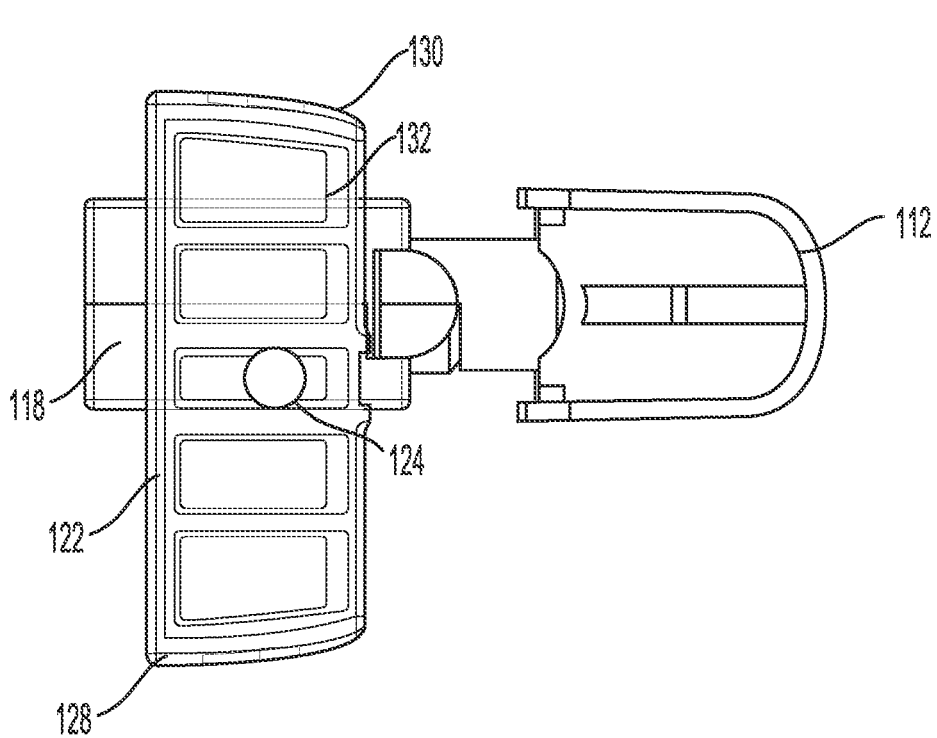

The selector switch 122 can be, for example, a lever or knob. In an embodiment, the selector switch 122 is slidably coupled to the housing 102 and is adapted to be selectively movable in a linear direction by a user between first and second positions. For example, when the selector switch 122 is disposed in the first position (as illustrated in FIG. 3), the motor 108 causes rotation of the output drive 110 in a first rotational direction (e.g., clockwise) when the trigger 112 is depressed. Likewise, when the selector switch 122 is disposed in the second position (as illustrated in FIG. 4), the motor 108 rotates the output drive 110 in a second direction opposite the first direction (e.g., counter clockwise or clockwise) when the trigger 112 is depressed. In another embodiment (not shown), the selector switch 122 is rotatably coupled to the housing 102 and is adapted to be selectively rotated in a clockwise and counterclockwise directions by a user between first and second positions to select the rotational direction of the output drive 110. U.S. patent application Ser. No. 16/834,665 illustrates an exemplary selector switch rotatably coupled to a power tool housing.

In the illustrated embodiment, the selector switch 122 is an elongated lever having opposing first and second end portions 128, 130. In an embodiment (as illustrated in FIGS. 3 and 4), the selector switch 122 includes spaced-apart recesses 132 formed to provide structural rigidity thereto. The selector switch 122 can be made from various types of polymeric materials or other suitable materials. In an embodiment, the selector switch 122 is a single unitary body formed, for example, via injection molding. In another embodiment, the selector switch 122 includes first and second portions that are releasably coupled together and that can be separated from each other to allow placement of the non-contact actuator 124 within the selector switch 122. In an embodiment, a detent structure, such as, for example, a detent ball or pin, can detain the selector switch in one of the first and second positions and provide tactile feedback to a user when the user has successfully selected the rotational direction of the motor 108 using known methods.

The non-contact actuator 124 is disposed in the selector switch 122. For purposes of illustration in FIGS. 3 and 4, the selector switch 122 is transparently illustrated to better illustrate the internally disposed non-contact actuator 124 within the selector switch 122. In an embodiment, the non-contact actuator 124 is disposed within one of the recesses 132. In another embodiment, the selector switch 122 is molded around the non-contact actuator 124. In an embodiment, the non-contact actuator 124 is a magnet.

The non-contact sensor 126 is adapted to detect the proximity of the non-contact actuator 124 without making physical contact therewith. Accordingly, the selector switch 122 can be located to determine if the selector switch 122 is disposed in one of either of the first and second positions. In an embodiment, the non-contact sensor 126 is a transducer, such as, for example, a hall sensor, that varies its output voltage in response to changes in magnetic field. The output voltage can then be used by a motor controller to control the motor 108. For example, when the non-contact actuator 124 and non-contact sensor 126 are in proximity (i.e., when the non-contact actuator 124 passes over the non-contact sensor 126) the non-contact sensor 126 outputs a first voltage, which causes the motor controller to operate the motor 108 in a first rotational direction. Conversely, when the non-contact actuator 124 is moved away from the non-contact sensor 126, the non-contact sensor 126 changes its output voltage to a second voltage, which causes the motor controller to operate the motor 108 in the second rotational direction. In another embodiment the non-contact sensor 126 is a capacitive sensor adapted to sense the proximity of the non-contact actuator 124. In another embodiment, the non-contact sensor 126 is an inductive sensor adapted to sense the proximity of the non-contact actuator 124. In this embodiment, the non-contact actuator 124 is composed of a metallic material. In another embodiment, the non-contact actuator 124 emits light adapted to be detected by the non-contact sensor 126, which includes a light sensor.

In an embodiment, the non-contact sensor 126 is coupled to a printed circuit board (PCB) 134. The PCB 134 may be disposed within the trigger housing 118 and positioned relative to the selector switch 122 to be proximate to the non-contact actuator 124 when the selector switch 122 is moved between the first and second positions. The PCB 134 can also include various electronic components utilized for operation of the tool 100. Although a single non-contact sensor 126 is illustrated, the present invention is not limited as such and any number of non-contact sensors may be utilized to determine the location of the non-contact actuator 124. In another embodiment, the PCB 134 is not disposed in the trigger housing 118, thereby allowing the direction selector mechanism 120 to be moved away from the trigger 112 to any desired location on the housing 102.

Accordingly, during use of the 100 (i.e., when the trigger 112 is actuated by an operator), the motor 108 selectively drives the output drive 110 in either one of clockwise or counterclockwise directions based on determining the position of the selector switch 122 using non-contact sensing. By using non-contact sensing, problems surrounding the existing selectors, such as, electrical contact corrosion, mechanical wear (abrasion), mechanical fatigue, foreign debris ingress, and vibration related contact loss, can be avoided by the present invention.

As used herein, the term "coupled" can mean any physical, electrical, magnetic, or other connection, either direct or indirect, between two parties. The term "coupled" is not limited to a fixed direct coupling between two entities.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of the inventors' contribution. The actual scope of the protection sought is intended to be defined in the following claims when viewed in their proper perspective based on the prior art.

What is claimed is:

1. A tool having a tool housing, a motor disposed in the tool housing and adapted to selectively rotate in either one of first and second rotational directions, a trigger switch, a detent structure, a motor controller, and a trigger operably coupled to the trigger switch to cause operation of the motor, the tool comprising:

a direction selector mechanism adapted to selectively cause the motor to rotate in one of the first and second rotational directions, the direction selector mechanism including:

a selector switch coupled to the tool and adapted to be selectively detained in either one of first and second positions by the detent structure;

a non-contact actuator encased within the selector switch; and a non-contact sensor disposed in the tool housing and adapted to detect the proximity of the non-contact actuator.

2. The tool of claim 1, wherein the first rotational direction is selected when the selector switch is disposed in the first position, and the second rotational direction is selected when the selector switch is disposed in the second position.

3. The tool of claim 1, further comprising a trigger housing, wherein each of the non-contact sensor and the trigger switch is disposed in the trigger housing.

4. The tool of claim 3, wherein the non-contact sensor is coupled to a printed circuit board, and the printed circuit board is disposed within the trigger housing and is proximate to the non-contact actuator.

5. The tool of claim 1, wherein the selector switch includes recesses, and wherein the non-contact actuator is disposed in one of the recesses.

6. The tool of claim 1, wherein the non-contact actuator includes a magnet.

7. The tool of claim 1, wherein the non-contact sensor includes a hall sensor.

8. The tool of claim 1, wherein the non-contact sensor includes an inductive sensor.

9. The tool of claim 1, wherein the non-contact sensor includes a capacitive sensor.

10. The tool of claim 1, wherein the non-contact actuator emits light and the non-contact sensor includes a light sensor adapted to sense light emitted by the non-contact actuator.

11. The tool of claim 1, wherein the non-contact sensor is coupled to a printed circuit board.

12. A direction selector mechanism adapted to cause a motor of a tool to selectively rotate in either one of first and second rotational directions, the direction selector mechanism comprising:

a selector switch slidably coupled to the tool and adapted to be selectively disposed in one of first and second positions, wherein the selector switch includes opposing first and second end portions, recesses formed in the selector switch between the first and second end portions, and ribs respectively separating the recesses;

a non-contact actuator disposed in one of the recesses of the selector switch; and a non-contact sensor adapted to detect the proximity of the non-contact actuator.

13. The direction selector mechanism of claim 12, wherein the first rotational direction is selected when the selector switch is disposed in the first position, and the second rotational direction is selected when the selector switch is disposed in the second position.

14. The direction selector mechanism of claim 12, wherein the non-contact sensor is disposed in a trigger housing of the tool.

15. The direction selector mechanism of claim 12, wherein the non-contact actuator includes a magnet.

16. The direction selector mechanism of claim 12, wherein the non-contact sensor includes a hall sensor.

17. The direction selector mechanism of claim 12, wherein the non-contact sensor is coupled to a printed circuit board.

18. The direction selector mechanism of claim 12, wherein the selector switch is molded over the non-contact actuator.

19. The direction selector mechanism of claim 12, wherein the non-contact sensor includes an inductive sensor.

20. The direction selector mechanism of claim 12, wherein the non-contact sensor includes a capacitive sensor.

21. The direction selector mechanism of claim 12, wherein the non-contact actuator emits light and the non-contact sensor includes a light sensor adapted to sense light emitted by the non-contact actuator.

\* \* \* \* \*